US009373840B2

(12) United States Patent
Inoue

(10) Patent No.: US 9,373,840 B2
(45) Date of Patent: Jun. 21, 2016

(54) NEGATIVE ELECTRODE ACTIVE MATERIAL FOR SECONDARY BATTERY AND METHOD FOR PRODUCING THE SAME

(71) Applicant: HONDA MOTOR CO., LTD., Minato-Ku, Tokyo (JP)

(72) Inventor: Kenshi Inoue, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 332 days.

(21) Appl. No.: 14/185,325

(22) Filed: Feb. 20, 2014

(65) Prior Publication Data

US 2014/0238550 A1 Aug. 28, 2014

(30) Foreign Application Priority Data

Feb. 25, 2013 (JP) ................................ 2013-034699

(51) Int. Cl.

| | |
|---|---|
| ***C22C 21/06*** | (2006.01) |
| ***C22C 45/08*** | (2006.01) |
| ***H01M 4/46*** | (2006.01) |
| ***C23C 14/34*** | (2006.01) |
| ***C23C 14/16*** | (2006.01) |
| *H01M 10/0525* | (2010.01) |

(52) U.S. Cl.

CPC ............... *H01M 4/463* (2013.01); *C22C 21/06* (2013.01); *C22C 45/08* (2013.01); *C23C 14/165* (2013.01); *C23C 14/3464* (2013.01); *H01M 10/0525* (2013.01)

(58) Field of Classification Search

None

See application file for complete search history.

(56) References Cited

U.S. PATENT DOCUMENTS

| | | | | |
|---|---|---|---|---|
| 5,340,416 | A * | 8/1994 | Shibata | C22C 23/02 148/420 |
| 5,350,468 | A * | 9/1994 | Masumoto | C22C 45/00 148/403 |
| 6,402,860 | B2 * | 6/2002 | Hashikura | C22C 1/0416 148/440 |
| 2012/0193001 | A1 * | 8/2012 | Khasin | C22C 21/02 148/695 |

FOREIGN PATENT DOCUMENTS

| | | |
|---|---|---|
| JP | 63-318070 A | 12/1988 |
| JP | 03-152874 A | 6/1991 |

* cited by examiner

*Primary Examiner* — George Wyszomierski

(74) *Attorney, Agent, or Firm* — Carrier Blackman & Associates, P.C.; Joseph P. Carrier; William D. Blackman

(57) ABSTRACT

A negative electrode active material for a secondary battery contains an aluminum alloy. The internal structure of the aluminum alloy has a crystalline aluminum phase in a magnesium-supersaturated solid solution state, and an amorphous aluminum phase. The amorphous aluminum phase is dispersed in the crystalline aluminum phase in the magnesium-supersaturated solid solution state. Each of these phases has a columnar shape. The magnesium content of the aluminum alloy preferably is greater than 22 at % and less than 35 at %, and more preferably, lies within a range of 25±2 at %.

3 Claims, 9 Drawing Sheets

10
12
200 nm

DISCHARGE CAPACITY [mAh/g]
0
200
400
600
800
1000
1200
1400
CYCLE NUMBER
200
225
250
275
300
5C
10C

NEGATIVE ELECTRODE ACTIVE MATERIAL FOR SECONDARY BATTERY AND METHOD FOR PRODUCING THE SAME

CROSS-REFERENCE TO RELATED APPLICATION

This application is based upon and claims the benefit of priority from Japanese Patent Application No. 2013-034699 filed on Feb. 25, 2013, the contents of which are incorporated herein by reference.

BACKGROUND OF THE INVENTION

1. Field of the Invention

The present invention relates to a negative electrode active material for a secondary battery and a method for producing the same.

2. Description of the Related Art

Secondary batteries have been widely used as electrical power sources for driving various electrical devices. As is well known, a secondary battery can be repeatedly charged and discharged, and thus can be used repeatedly. For example, in a lithium ion secondary battery, materials capable of releasing and storing lithium ions are used in positive and negative electrodes, and the lithium ions are transferred between the electrodes in charging and discharging cycles. In charging and discharging reactions, the active materials in the positive and negative electrodes act to release lithium ions to the outside and to absorb lithium ions from the outside, and thereby undergo changes in volume.

For example, aluminum, which has a lithium ion storage capacity higher than that of carbon materials or the like, has been proposed for use as the negative electrode active material for a secondary battery. However, the volume of a negative electrode active material that is composed of aluminum is likely to be changed excessively during charging and discharging reactions. Therefore, this material often becomes deteriorated (e.g., converted into a fine powder or dropped off) in reactions, which tends to shorten the life cycle of the secondary battery.

For example, Japanese Laid-Open Patent Publication No. 63-318070 and Japanese Laid-Open Patent Publication No. 03-152874 propose an aluminum alloy, which is usable as a secondary battery negative electrode active material with high capacity and improved durability. More specifically, as disclosed in Japanese Laid-Open Patent Publication No. 63-318070, 20 wt % or less of magnesium is added to an aluminum melt to prepare an aluminum-magnesium alloy as the lithium secondary battery negative electrode active material. On the other hand, in a non-aqueous electrolyte battery, as described in Japanese Laid-Open Patent Publication No. 03-152874, 15.0 wt % or less of magnesium is added to aluminum to prepare a solid solution of an aluminum alloy as the negative electrode active material.

SUMMARY OF THE INVENTION

In recent years, various studies have been conducted on the use of secondary batteries as a large power source for a hybrid vehicle, an electric vehicle, or the like. A large secondary battery is required to exhibit an excellent life cycle, in particular. However, the negative electrode active materials described in Japanese Laid-Open Patent Publication No. 63-318070 and Japanese Laid-Open Patent Publication No. 03-152874 do not have satisfactory durability, and if such materials are used, it is difficult to produce a secondary battery having a sufficiently long life cycle. Accordingly, there is a demand in the art to develop a negative electrode active material having improved durability.

A principal object of the present invention is to provide a secondary battery negative electrode active material having a high capacity, which can effectively be prevented from undergoing a large change in volume and thereby exhibit excellent durability.

Another object of the present invention is to provide a secondary battery negative electrode active material capable of sufficiently improving the life cycle of a secondary battery.

A further object of the present invention is to provide a method for producing the secondary battery negative electrode active material.

According to an aspect of the present invention, there is provided a secondary battery negative electrode active material comprising an aluminum alloy containing magnesium. The aluminum alloy has a crystalline aluminum phase and an amorphous aluminum phase, and the crystalline aluminum phase is in a magnesium-supersaturated solid solution state.

The crystalline aluminum phase in a magnesium (Mg)-supersaturated solid solution state (hereinafter also referred to as a supersaturated crystalline Al phase) possesses a higher capacity as compared with carbon materials or the like, and undergoes a smaller change in volume during charging and discharging reactions as compared with aluminum (Al) or the like. The change in volume of the amorphous aluminum phase (hereinafter also referred to as an amorphous Al phase) is even smaller than that of the supersaturated crystalline Al phase during charging and discharging reactions. Therefore, the secondary battery negative electrode active material of the present invention, which contains an aluminum alloy (Al alloy) having a supersaturated crystalline Al phase and an amorphous Al phase, exhibits a high capacity and can effectively be prevented from undergoing a large change in volume during charging and discharging reactions. Thus, the negative electrode active material does not become converted into a fine powder, does not drop off, exhibits excellent durability, and is capable of effectively improving the life cycle of a secondary battery.

In the secondary battery negative electrode active material, preferably, the crystalline aluminum phase in the magnesium-supersaturated solid solution state and the amorphous aluminum phase each have a columnar shape, and the amorphous aluminum phase is dispersed in the crystalline aluminum phase in the magnesium-supersaturated solid solution state. In this case, the entire negative electrode active material can effectively be prevented from undergoing a change in volume during charging and discharging reactions, and the negative electrode active material exhibits excellent durability and strength.

Preferably, the magnesium content of the aluminum alloy is greater than 22 at % and less than 35 at %. If the magnesium content is 22 at % or less, it is often difficult to form the amorphous Al phase in the Al alloy. On the other hand, if the magnesium content is 35 at % or more, an $Al_3Mg_2$ phase, which does not contribute to the charging and discharging reactions, tends to be formed in the Al alloy, instead of the supersaturated crystalline Al phase and the amorphous Al phase.

If the magnesium content of the Al alloy lies within the above range, the supersaturated crystalline Al phase and the amorphous Al phase can be formed appropriately, and the negative electrode active material can exhibit a high capacity with improved durability.

It is further preferable that the magnesium content of the aluminum alloy lies within a range of 25±2 at %. In this case, the capacity and durability of the negative electrode active material can be further improved.

The secondary battery negative electrode active material can suitably be used in a lithium ion battery.

According to another aspect of the present invention, there is provided a method for producing a secondary battery negative electrode active material including an aluminum alloy containing magnesium. The method comprises the step of, by a binary sputtering process using aluminum and magnesium targets, forming the aluminum alloy having a crystalline aluminum phase and an amorphous aluminum phase, and the crystalline aluminum phase is in a magnesium-supersaturated solid solution state.

Using the above method, the negative electrode active material having the aforementioned structure can easily be produced.

For reasons discussed above, the magnesium content of the aluminum alloy preferably is greater than 22 at % and less than 35 at %, and more preferably, lies within a range of 25±2 at %.

The above and other objects, features and advantages of the present invention will become more apparent from the following description when taken in conjunction with the accompanying drawings in which a preferred embodiment of the present invention is shown by way of illustrative example.

DESCRIPTION OF THE PREFERRED EMBODIMENTS

A preferred embodiment of a secondary battery negative electrode active material of the present invention will be described in detail below with reference to the accompanying drawings.

A secondary battery negative electrode active material according to the present embodiment (hereinafter also referred to as a negative electrode active material) is composed of an aluminum alloy (Al alloy) prepared by adding magnesium (Mg) to aluminum (Al). The negative electrode active material can be used in a non-aqueous electrolyte secondary battery such as a lithium ion secondary battery. The Al alloy has a crystalline aluminum phase in an Mg-supersaturated solid solution state (supersaturated crystalline Al phase), and an amorphous aluminum phase (amorphous Al phase). More specifically, the supersaturated crystalline Al phase and the amorphous Al phase each have a columnar shape, and the Al alloy has an internal structure in which the amorphous Al phase is finely dispersed in the supersaturated crystalline Al phase. The Al alloy can be prepared by a binary sputtering process using Al and Mg.

Figure 1:
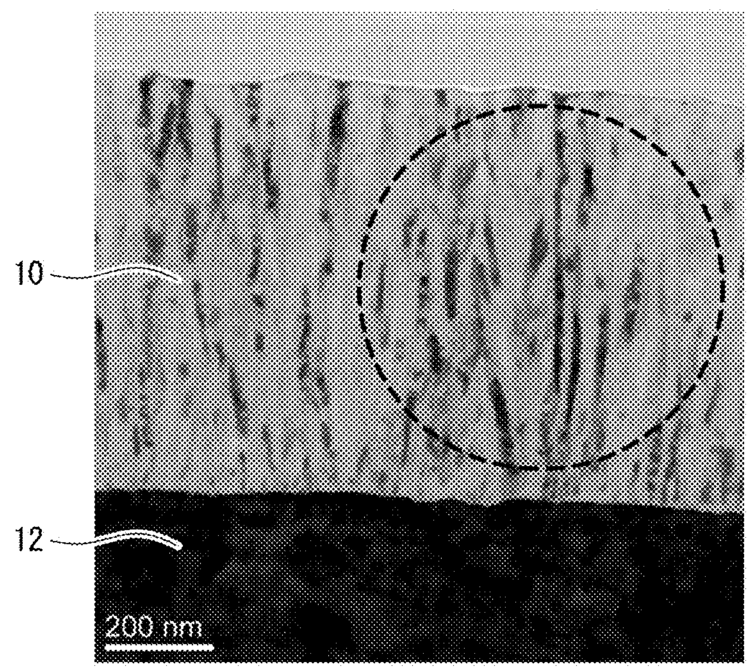
FIG. 1 is a bright-field cross-sectional image, which was obtained by transmission electron microscope (TEM) observation, of a film using an example of an Al alloy for a secondary battery negative electrode active material according to the present invention.

The internal structure of the Al alloy will be described in detail below with reference to FIGS. 1 to 6. An Al alloy 10 shown in FIG. 1 is an example of the Al alloy in the negative electrode active material of the present invention. It should be understood that the composition and structure of the Al alloy are not necessarily limited specifically to the composition and structure of the Al alloy 10 to be hereinafter described.

FIG. 1 is a bright-field image, which was obtained by transmission electron microscope (TEM) observation, of the Al alloy 10 employed in the negative electrode active material of the present embodiment. The Al alloy 10 is disposed on a stainless steel (SUS) substrate 12.

The Al alloy 10 has an Al content of 75 atomic % (at %) and an Mg content of 25 at %. In addition, the Al alloy 10 is formed on the SUS substrate 12 by a binary sputtering process using Al and Mg targets having purities of 4N (99.99 wt % or more). More specifically, a film of the Al alloy 10 having a thickness of 1 μm is formed under the following conditions:

Background pressure: less than $3\times10^{-6}$ Pa

Process gas/pressure/flow rate: Ar/0.7 Pa/50 sccm

Applied electric power (Al target/Mg target): DC 200 W×2/RF 85 W

Film forming temperature: 25° C.

Rotation rate of substrate holder: 3 rpm

Film forming time: 2 hours, 27 minutes, 14 seconds.

As made clear from FIG. 1, each of the grains in the internal structure of the Al alloy 10 has a columnar shape.

Figure 2:
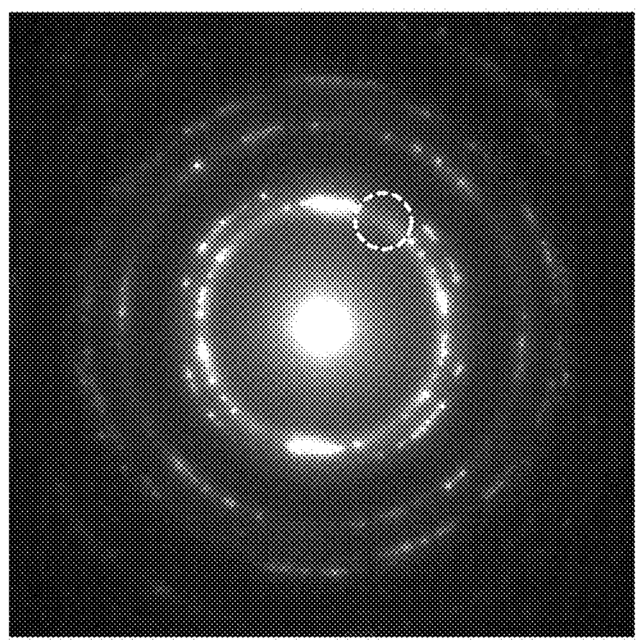
FIG. 2 is an electron diffraction pattern obtained by a selected-area diffraction method of an area shown by the dashed-line circle in FIG. 1.

An electron diffraction pattern of an area, which is shown by the dashed-line circle in FIG. 1 and is obtained by a selected-area diffraction method, is shown in FIG. 2. A Debye-Scherrer ring and a halo ring are clearly shown in FIG. 2. Thus, the internal structure of the Al alloy 10 clearly has a crystalline phase and an amorphous phase. More specifically, the Debye-Scherrer ring corresponds to the crystalline phase, and the halo ring corresponds to the amorphous phase.

Figure 3:
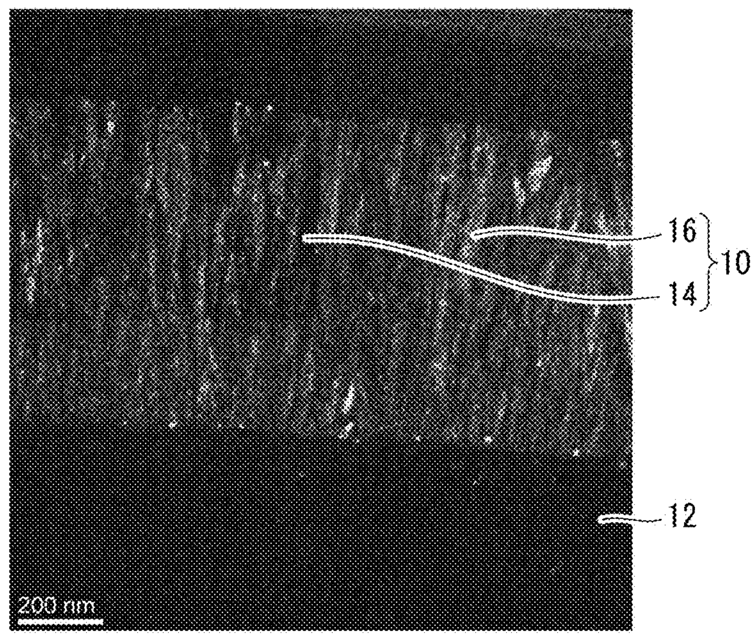
FIG. 3 is a dark-field image of an area shown by the dashed-line circle in the electron diffraction pattern of FIG. 2.

This feature of the invention also is supported by FIG. 3, which is a dark-field image of an area shown by the dashed-line circle in FIG. 2. In FIG. 3, black portions correspond to the crystalline phase, and white portions correspond to the amorphous phase. As shown in FIG. 3, in the internal structure of the Al alloy 10, an amorphous phase 16 having a columnar shape is finely dispersed within a crystalline phase 14 having a columnar shape.

Figure 4:
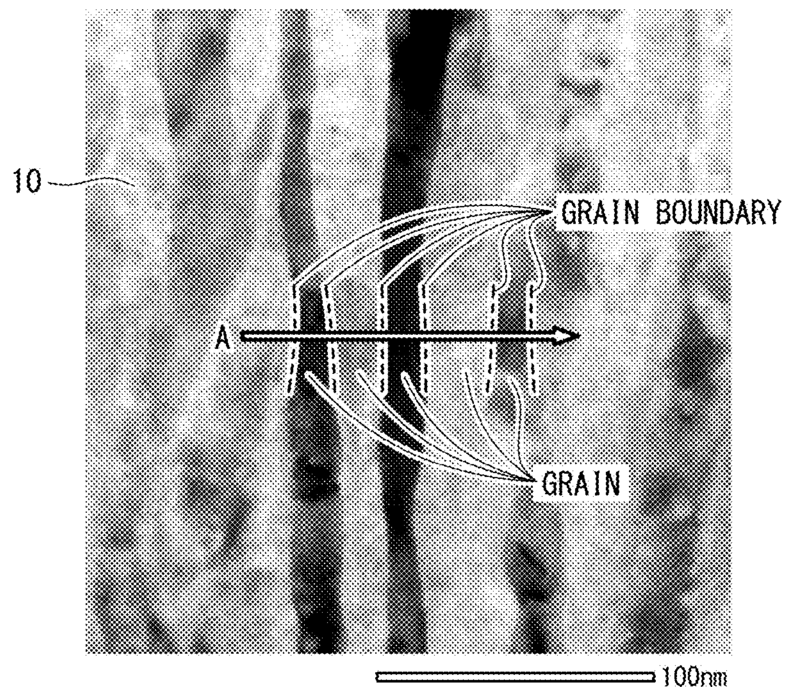
FIG. 4 is an enlarged image of FIG. 1.
Figure 5:
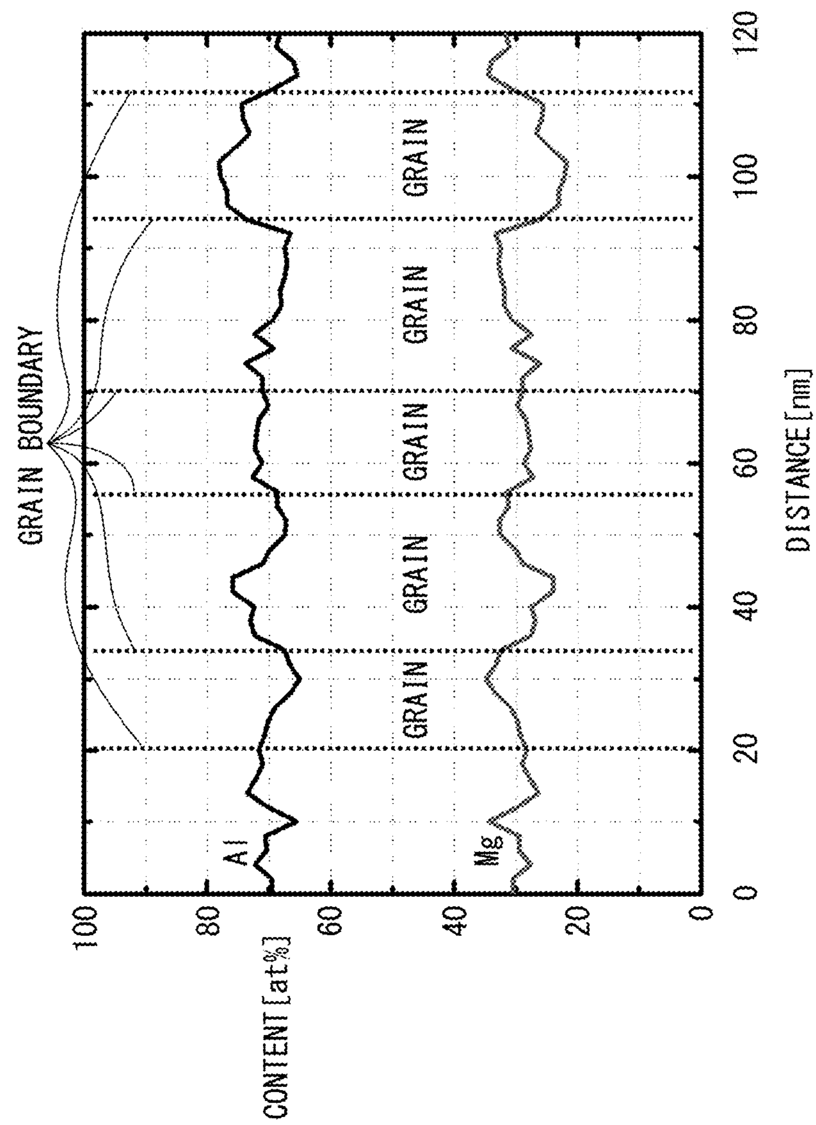
FIG. 5 is a chart of line analysis results obtained using an energy dispersive X-ray analyzer (EDX), while an electron beam is moved in the direction of the arrow A in FIG. 4.

An enlarged image of FIG. 1 is shown in FIG. 4. Results of a line analysis using an energy dispersive X-ray analyzer (EDX) are shown in FIG. 5. In the line analysis, an electron beam is moved in the direction of the arrow A of FIG. 4. In FIG. 5, the horizontal axis indicates a distance (nm) of movement of the electron beam, whereas the vertical axis indicates the Mg and Al content (at %) of the Al alloy 10. As shown in FIGS. 4 and 5, in the internal structure of the Al alloy 10, the columnar-shaped grains and the grain boundaries have approximately the same composition ratio, and the Al alloy 10 contains about 75 at % of Al and about 25 at % of Mg.

In addition, as shown in FIGS. 4 and 5, the columnar-shaped grains (i.e., the crystalline phase 14 and the amorphous phase 16) each have a width of about 20 nm.

Figure 6:
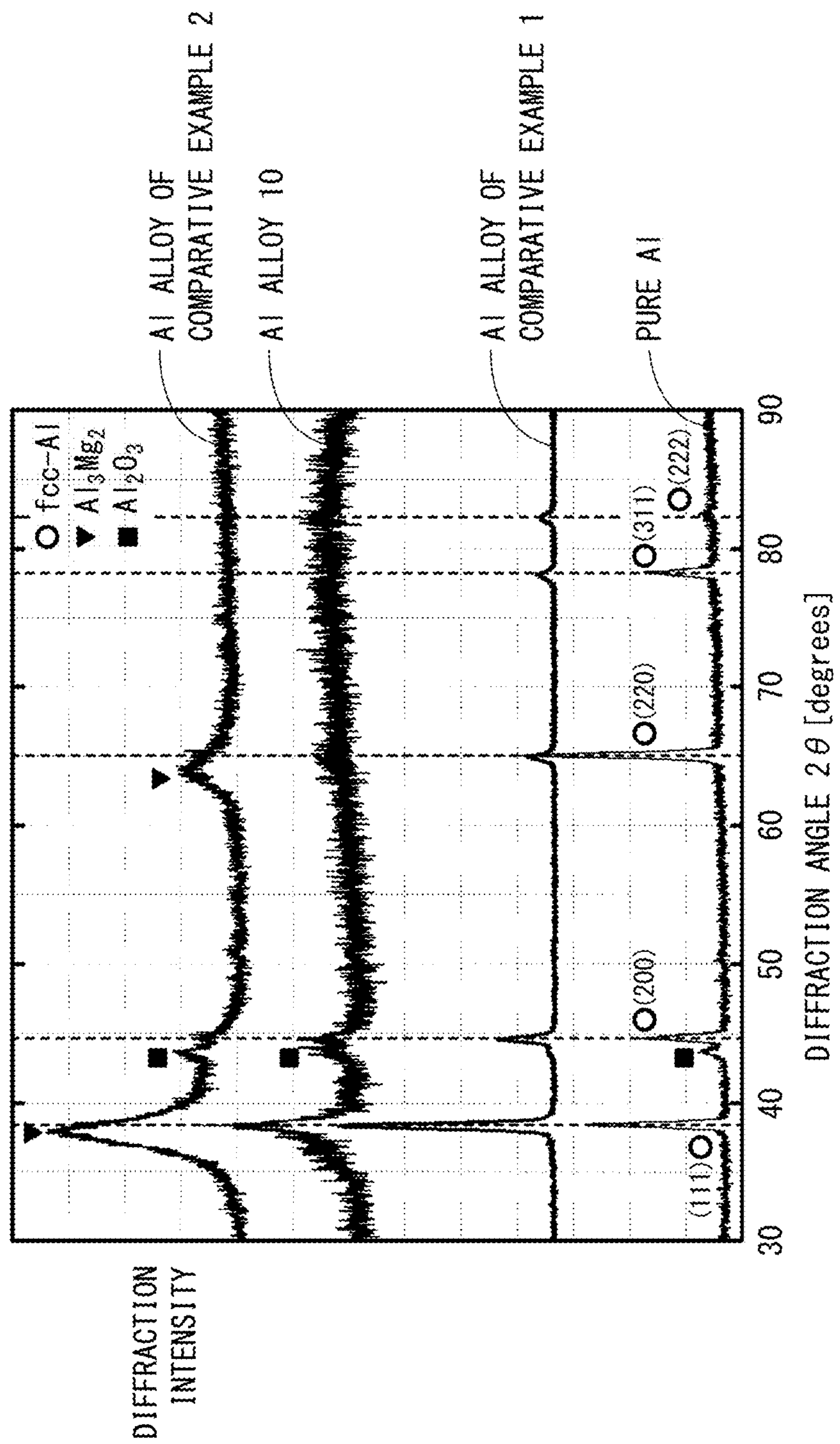
FIG. 6 shows X-ray diffraction (XRD) patterns of the Al alloy of FIG. 1, Al alloys according to comparative examples 1 and 2, and pure Al, which were measured using an in-plane method.

An X-ray diffraction (XRD) pattern of the Al alloy 10, as measured by an in-plane method, is shown in FIG. 6. In FIG. 6, the horizontal axis indicates the diffraction angle 2θ (°) and the vertical axis indicates the diffraction intensity (arbitrary units). In addition, X-ray diffraction (XRD) patterns of an Al alloy according to comparative example 1, which contains 95 at % of Al and 5 at % of Mg, an Al alloy according to comparative example 2, which contains 65 at % of Al and 35 at % of Mg, and pure Al, as measured in the same manner by the in-plane method, are shown in FIG. 6.

The Al alloy film of comparative example 1 was formed under the same conditions as the film of the Al alloy 10, except that an RF electric power of 10 W was applied to the Mg target, and the film forming time was 3 hours, 6 minutes, 5 seconds, in order to obtain an Al content of 95 at % and a Mg content of 5 at %. The Al alloy film of comparative example 2 was formed under the same conditions as the film of the Al alloy 10, except that an RF electric power of 118 W was applied to the Mg target, and the film forming time was 2 hours, 7 minutes, 36 seconds, in order to obtain an Al content of 65 at % and a Mg content of 35 at %. A film of pure Al according to the reference example was formed by a sputtering process using an Al target.

In a comparison of the XRD patterns of pure Al and the Al alloy 10, pure Al exhibits peaks corresponding to a face-centered cubic structure of the Al crystal (fcc-Al, marked by white circles in FIG. 6), whereas the Al alloy 10 exhibits peaks at the same diffraction angles 2θ. In addition, the Al alloy 10 does not exhibit peaks corresponding to Mg. Thus, it is clear that the Al alloy 10 exhibits a crystalline fcc-Al phase in an Mg-containing solid solution state.

The XRD patterns of FIG. 6 were obtained using an in-plane method. Therefore, in each pattern, a peak corresponding to an oxide layer that is formed on the outermost surface of the sample, and which is marked by a black square in FIG. 6, is observed at a diffraction angle 2θ of about 44°.

Furthermore, the Al alloy 10 exhibits broad peaks corresponding to the amorphous phase over the XRD pattern. In particular, the broad peak is noticeable around the peak, corresponding to the (111) face in the pure Al crystal structure. Thus, it is clear that the Al alloy 10 has an amorphous Al phase in addition to the crystalline fcc-Al phase.

The crystalline phase 14 is a crystalline Al phase in a Mg-containing solid solution state, and the amorphous phase 16 is an amorphous Al phase. Therefore, the amorphous phase 16 will hereinafter also be referred to as an amorphous Al phase 16.

In accordance with an equilibrium diagram of a binary Al—Mg system, the maximum solid solubility limit of Mg in Al is approximately 15 at % at a eutectic point of about 450° C. Therefore, according to the technique described in Japanese Laid-Open Patent Publication No. 63-318070, 20 wt % of Mg is added, with 15 wt % thereof being solid-dissolved, and the remaining 5 wt % thereof being in a free state.

In contrast, as made clear from FIGS. 5 and 6, in the Al alloy 10, 25 at % of Mg is in a solid solution state in the crystalline phase 14. More specifically, approximately 25 at % of Mg is solid-dissolved in Al, as shown in the composition analysis results of FIG. 5, and an Mg peak is not formed, as shown in FIG. 6.

In other words, over the entire columnar-shaped internal structure thereof, the Mg content of the Al alloy 10 is more than the maximum solid solubility limit, and the crystalline phase 14 contains Al in an Mg-supersaturated solid solution state. Thus, the crystalline phase 14 of the Al alloy 10 is a supersaturated crystalline Al phase. Accordingly, the crystalline phase 14 will hereinafter also be referred to as a supersaturated crystalline Al phase 14.

For example, in the case of using the Al alloy 10 having the above internal structure as the negative electrode active material in a lithium ion secondary battery, the Al alloy 10 is capable of reversibly storing and releasing lithium ions during charging and discharging cycles. In this case, the supersaturated crystalline Al phase 14 in the Al alloy 10 can store and release a larger amount of lithium ions, as well as exhibiting a higher capacity as compared with carbon materials or the like. Furthermore, the supersaturated crystalline Al phase 14 undergoes only a small change in volume during charging and discharging reactions as compared with Al or the like. In addition, the amorphous Al phase 16 exhibits lower reactivity in the charging and discharging reactions, whereby the change in volume of the amorphous Al phase 16 is further reduced compared with the supersaturated crystalline Al phase 14 during such reactions.

Therefore, the negative electrode active material of the Al alloy 10, which has the supersaturated crystalline Al phase 14 and the amorphous Al phase 16 dispersed therein, can exhibit a high capacity and can effectively be prevented from undergoing a large change in volume during charging and discharging reactions. Even if the charging and discharging reactions are carried out repeatedly, the negative electrode active material is not converted into a fine powder and does not drop off. Thus, the negative electrode active material has excellent durability, and is capable of effectively improving the life cycle of the secondary battery.

The Al alloy 10 also exhibits improved strength, since the supersaturated crystalline Al phase 14 and the amorphous Al phase 16 in the Al alloy 10 each have a columnar shape, and the amorphous Al phase 16 is finely dispersed in the supersaturated crystalline Al phase 14. Furthermore, since the supersaturated crystalline Al phase 14 and the amorphous Al phase 16 are distributed over the entire Al alloy 10, a high capacity can be achieved, and a change in volume during charging and discharging cycles can be prevented, thereby improving durability of the Al alloy 10 as a whole. Thus, a high capacity and improved durability can effectively be achieved over the entire negative electrode active material.

In the present embodiment, in the Al alloy 10 of the negative electrode active material, for the purpose of more suitably increasing capacity and preventing a change in volume during charging and discharging reactions, the Mg content of the Al alloy 10 preferably is greater than 22 at % and less than 35 at %, and more preferably, lies within a range of 25±2 at %.

In the case that the Mg content is 22 at % or less, e.g., in the Al alloy of comparative example 1, which has an Mg content of 5 at %, peaks corresponding to the crystalline fcc-Al phase are formed, however, broad peaks are not observed in the XRD pattern, as shown in FIG. 6. In the Al alloy of comparative example 1, even though a crystalline Al phase was formed in the Mg-containing solid solution state, the amorphous Al phase was not satisfactorily formed. Furthermore, because the Mg content is less than the maximum solid solubility limit of approximately 15 at %, the crystalline fcc-Al phase is not present in the Mg-supersaturated solid solution state. Thus, when the Mg content is 22 at % or less, both the supersaturated crystalline Al phase 14 and the amorphous Al phase 16 are not formed in the Al alloy.

On the other hand, in the case that the Mg content is 35 at % or greater, e.g., in the Al alloy of comparative example 2, which has an Mg content of 35 at %, the intensities of the peaks corresponding to the crystalline fcc-Al phase are reduced, and a peak corresponding to an $Al_3Mg_2$ phase (indicated by the black inverted triangle) was observed in the XRD pattern, as shown in FIG. 6. Thus, if the Mg content is 35 at % or greater, an $Al_3Mg_2$ phase, which does not contribute to the charging and discharging reactions, is formed predominantly in the Al alloy, instead of the supersaturated crystalline Al phase 14 and the amorphous Al phase 16.

The Al alloy 10 and the Al alloys of comparative examples 1 and 2 were each used, respectively, as a negative electrode active material in a lithium ion secondary battery. A half-cell using each alloy was prepared and subjected to a charge and discharge test, and the life cycle thereof was examined.

More specifically, a half-cell A was prepared in which the Al alloy 10 was used as a working electrode (negative electrode active material), a lithium (Li) foil (having a diameter of 15 mm and a thickness of 0.1 mm) was used as a counter electrode, and a solution containing 1 mol/l of lithium hexafluorophosphate ($LiPF_6$) in a mixed solvent was used as an electrolytic solution. The mixed solvent was prepared by mixing ethylene carbonate ($C_3H_4O_3$) and diethyl carbonate ($C_5H_{10}O_3$) at a volume ratio of 1:1. Furthermore, a half-cell B was prepared in the same manner as the half-cell A, except for using the Al alloy of comparative example 1 instead of the Al alloy 10 as the negative electrode active material.

Each of the half-cells A and B was subjected to a charge and discharge test using an electrochemical measuring device (PS-08 manufactured by Toho Technical Research Co., Ltd.) in order to evaluate the discharge capacity change associated with an increased number of charging and discharging cycles. The charge and discharge test was carried out at a constant cut-off potential of 0 to 1 V (vs. $Li^+/Li$) during the charging and discharging cycles. First, the discharge capacity of each half-cell was measured in 100 cycles at a current density corresponding to 0.2 C (200 mA/g) for the capacity density of the negative electrode active material. Next, the discharge capacity was measured in 50 cycles at a current density corresponding to 1 C (1 A/g), and then was measured in 50 cycles at a current density corresponding to 2 C (2 A/g), for the capacity density of the negative electrode active material.

Figure 7:
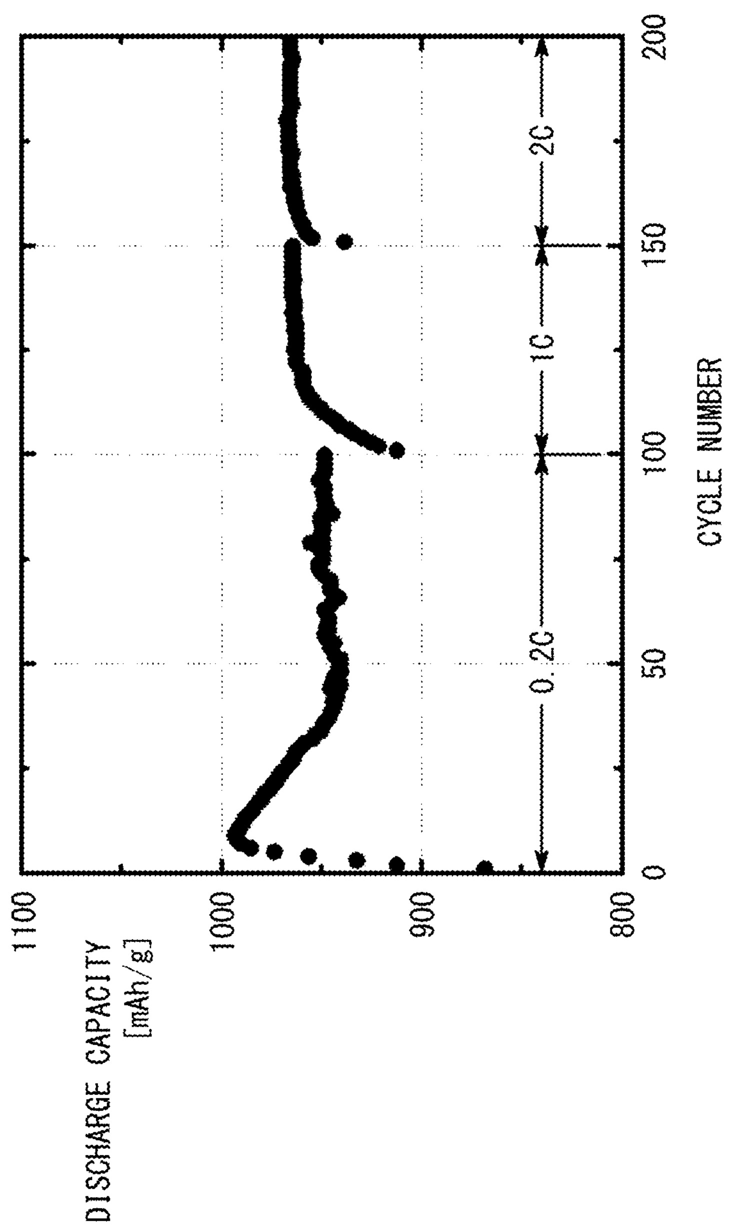
FIG. 7 is a chart of charge and discharge test results of a half-cell using the Al alloy of FIG. 1 as a negative electrode active material.

Results of the charge and discharge test of the half-cell A are shown in FIG. 7. In FIG. 7, the horizontal axis indicates the number of cycles, and the vertical axis indicates the discharge capacity (mAh/g). Incidentally, the negative electrode active material of the Al alloy 10 had a capacity density of 0.22 $mAh/cm^2$. Further, the current density thereof corresponding to 0.2 C was 0.004 $mA/cm^2$, the current density thereof corresponding to 1 C was 0.22 $mA/cm^2$, and the current density thereof corresponding to 2 C was 0.44 $mA/cm^2$.

As shown in FIG. 7, the final discharge capacity values of the half-cell A did not become lowered during the charging and discharging cycles carried out at any current density. In addition, it was confirmed that the half-cell A had an excellent life cycle.

Figure 8:
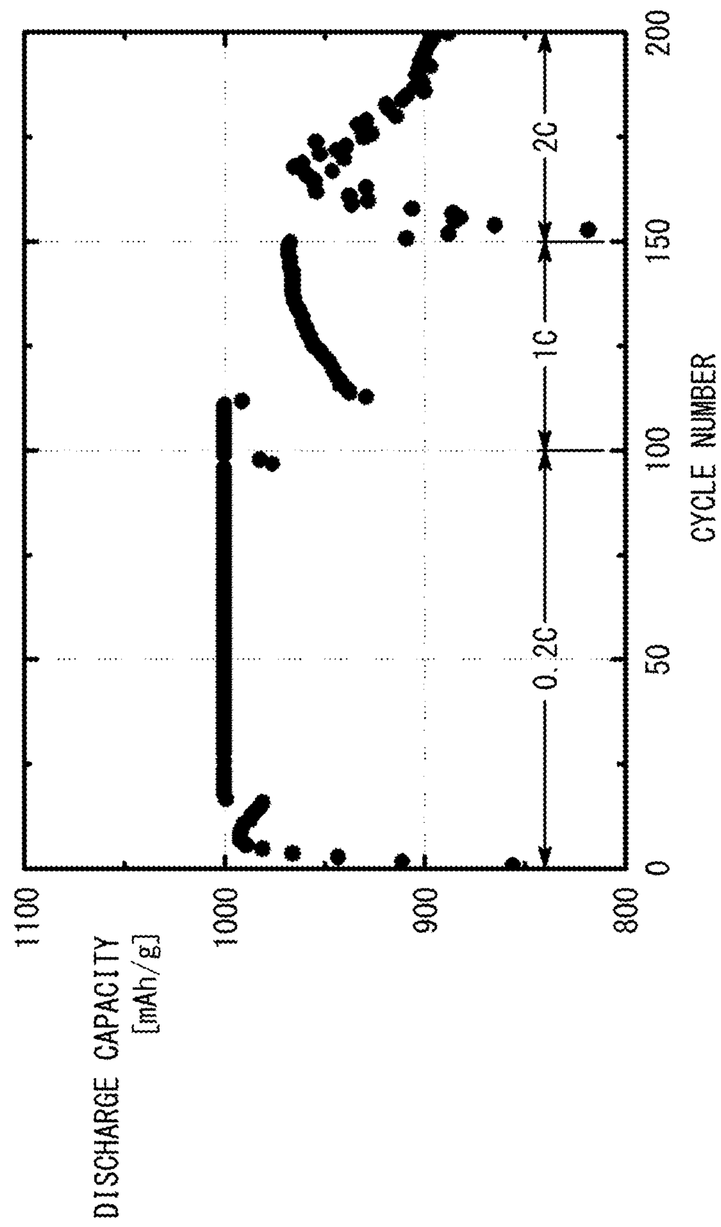
FIG. 8 is a chart of charge and discharge test results of a half-cell using the Al alloy of comparative example 1 as a negative electrode active material.

Results of the charge and discharge test of the half-cell B are shown in FIG. 8. Incidentally, the negative electrode active material of the Al alloy of comparative example 1 had a capacity density of 0.25 $mAh/cm^2$. Further, the current density thereof corresponding to 0.2 C was 0.050 $mA/cm^2$, the current density thereof corresponding to 1 C was 0.25 $mA/cm^2$, and the current density thereof corresponding to 2 C was 0.20 $mA/cm^2$.

As shown in FIG. 8, the discharge capacity values of the half-cell B were significantly lowered in repeated charging and discharging cycles at a current density corresponding to 2 C. Thus, the half-cell B was inferior in terms of its life cycle property in comparison with the half-cell A. The Al alloy of comparative example 1 undergoes a large change in volume during charging and discharging reactions, although the Al alloy exhibits a slight increase in current density, because the amorphous Al phase 16 is not formed appropriately, as described above. Consequently, the negative electrode active material containing the Al alloy of comparative example 1 is likely to become converted into a fine powder or to drop off, thereby shortening the life cycle of the half-cell B.

Furthermore, a half-cell C was prepared in the same manner as the half-cell A, except that the Al alloy of comparative example 2 was used as the negative electrode active material instead of the Al alloy 10. Also, the half-cell C was subjected to the same charge and discharge test as described above. However, in this case, a charge reaction did not proceed in the half-cell C, with the result that the charge and discharge test could not be performed. This is considered to be due to the fact that the $Al_3Mg_2$ phase was formed predominantly in the Al alloy of comparative example 2, instead of the supersaturated crystalline Al phase 14 and the amorphous Al phase 16, as described above.

As described above, by controlling the Mg content of the Al alloy at a level of greater than 22 at % and less than 35 at % (more preferably, within a range of 25±2 at %), the Al alloy can acquire an appropriately formed supersaturated crystalline Al phase and an amorphous Al phase. Further, the negative electrode active material can exhibit a high capacity and improved durability. Thus, the negative electrode active material of the present embodiment is capable of effectively improving the life cycle of the secondary battery.

Figure 9:
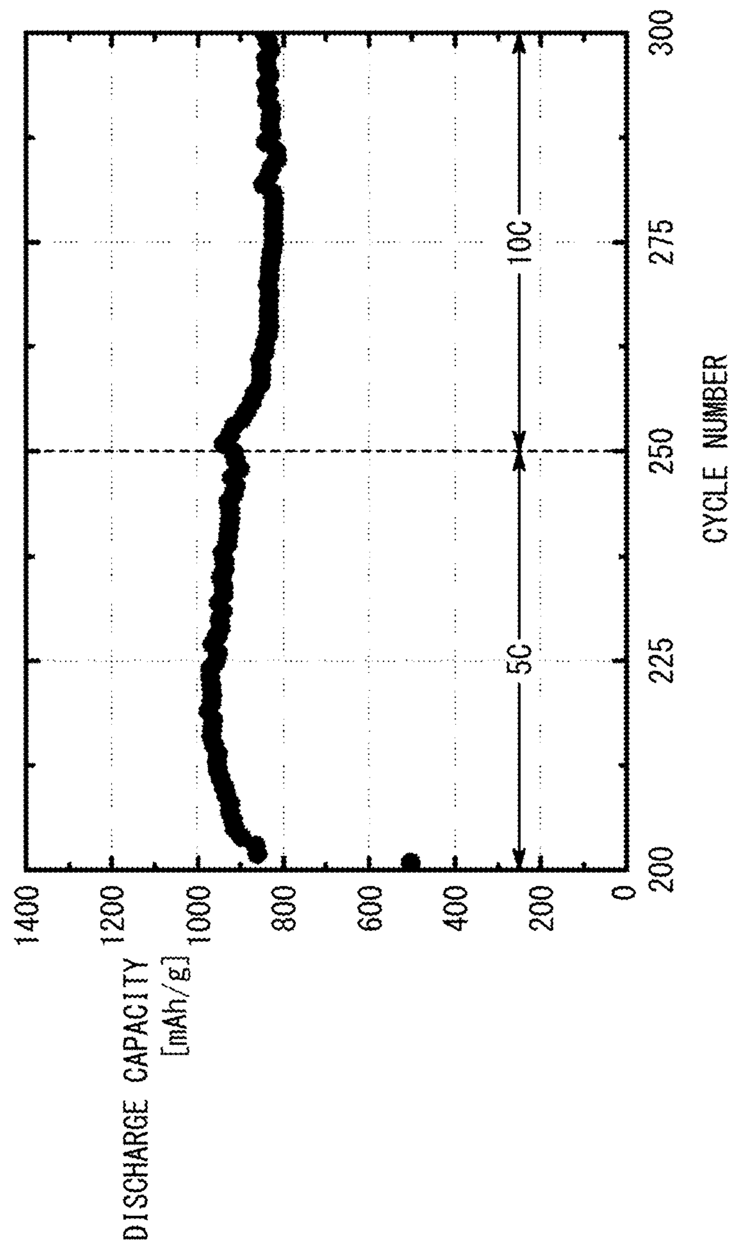
FIG. 9 is a chart of additional charge and discharge test results of the half-cell using the Al alloy of FIG. 1 as the negative electrode active material.

As shown in FIG. 9, an additional charge and discharge test was carried out in order to further evaluate the life cycle of the half-cell A. More specifically, after carrying out the above-described charge and discharge test, an additional charge and discharge test was carried out at a constant cut-off potential of 0 to 0.55 V (vs. $Li^+/Li$) during the charging and discharging cycles. First, the discharge capacity of the half-cell A was measured in 50 cycles at a current density of 1.1 $mA/cm^2$, corresponding to 5 C (5 A/g). Next, the discharge capacity was measured in 50 cycles at a current density of 2.2 $mA/cm^2$, corresponding to 10 C (10 A/g).

As shown in FIG. 9, the discharge capacity value of the half-cell A was hardly deteriorated, and the half-cell A exhibited an excellent life cycle, even during the additional charge and discharge test using the higher current density. Therefore, clearly, the secondary battery using the negative electrode active material of the Al alloy 10 can exhibit the effect of an excellent life cycle.

The present invention is not limited to the above embodiment, and various changes and modifications may be made to the embodiment without departing from the scope of the invention as set forth in the appended claims.

For example, instead of a lithium ion battery, the Al alloy 10 may be used as a negative electrode active material in another type of secondary battery.

While the invention has been particularly shown and described with reference to a preferred embodiment, it will be understood that variations and modifications can be effected thereto by those skilled in the art without departing from the scope of the invention as defined by the appended claims.

What is claimed is:

1. A negative electrode active material for a secondary battery, comprising an aluminum alloy containing magnesium, wherein:

the aluminum alloy has a crystalline aluminum phase and an amorphous aluminum phase;

the crystalline aluminum phase is in a magnesium-supersaturated solid solution state;

the crystalline aluminum phase in the magnesium-supersaturated solid solution state and the amorphous aluminum phase each have a columnar shape; and the amorphous aluminum phase is dispersed in the crystalline aluminum phase in the magnesium-supersaturated solid solution state.

2. A negative electrode active material for a secondary battery, comprising an aluminum alloy containing magnesium, wherein:

the aluminum alloy has a crystalline aluminum phase and an amorphous aluminum phase;

the crystalline aluminum phase is in a magnesium-supersaturated solid solution state; and the magnesium content of the aluminum alloy is greater than 22 at % and less than 35 at %.

3. A negative electrode active material for a secondary battery, comprising an aluminum alloy containing magnesium, wherein:

the aluminum alloy has a crystalline aluminum phase and an amorphous aluminum phase;

the crystalline aluminum phase is in a magnesium-supersaturated solid solution state; and the magnesium content of the aluminum alloy lies within a range of 25±2 at %.

* * * * *